United States Patent
Lee et al.

(10) Patent No.: US 7,733,260 B2
(45) Date of Patent: Jun. 8, 2010

(54) MULTISTAGE AMPLIFIER AND A METHOD OF SETTLING THE MULTISTAGE AMPLIFIER

(75) Inventors: Jung-ho Lee, Gunpo-si (KR); Jung-eun Lee, Seongnam-si (KR); Hong-rak Son, Hwaseong-si (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 12/169,005

(22) Filed: Jul. 8, 2008

(65) Prior Publication Data

US 2009/0195433 A1    Aug. 6, 2009

(30) Foreign Application Priority Data

Feb. 1, 2008  (KR) ...................... 10-2008-0010715

(51) Int. Cl.
*H03M 1/12*    (2006.01)

(52) U.S. Cl. ..................................... 341/155; 330/150

(58) Field of Classification Search ......... 341/155–170; 330/150, 310

See application file for complete search history.

(56) References Cited

U.S. PATENT DOCUMENTS

| | | |
|---|---|---|
| 5,541,602 A | 7/1996 | Opris et al. |
| 5,892,472 A | 4/1999 | Shu et al. |
| 5,894,283 A | 4/1999 | Fischer et al. |
| 6,566,942 B2 * | 5/2003 | Shigenobu ................... 330/9 |
| 6,750,724 B1 * | 6/2004 | Mori et al. .................. 330/310 |
| 6,784,814 B1 | 8/2004 | Nair et al. |
| 2008/0012718 A1 * | 1/2008 | Aoki et al. .................. 340/657 |

FOREIGN PATENT DOCUMENTS

JP    11-122107    4/1999

* cited by examiner

*Primary Examiner*—Lam T Mai
(74) *Attorney, Agent, or Firm*—NSIP Law

(57) ABSTRACT

A method of settling an amplifier and a multistage amplifier are provided. To settle an amplifier, a plurality of clock signals are, respectively, applied to preset switches, each of which is placed between amplifiers connected in cascade, to open the preset switches sequentially, thereby settling the amplifiers in order.

10 Claims, 5 Drawing Sheets

MULTISTAGE AMPLIFIER AND A METHOD OF SETTLING THE MULTISTAGE AMPLIFIER

CROSS REFERENCE TO RELATED APPLICATIONS

This application claims the benefit under 35 U.S.C. §119 (a) of a Korean Patent Application No. 10-2008-0010715, filed on Feb. 1, 2008, in the Korean Intellectual Property Office, the disclosure of which is incorporated herein in its entirety by reference.

TECHNICAL FIELD

The following description relates to an amplifier, and more particularly, to a method for settling a multistage amplifier and a multistage amplifier using the same.

BACKGROUND

Generally, a multistage amplifier includes a plurality of amplifiers connected in cascade such that an initial input signal is amplified by passing through several amplifiers. In this case, an output of a preceding amplifier becomes an input of a following amplifier and an output of the following amplifier becomes an input of the next amplifier, and so on.

Each amplifier included in the multistage amplifier may be formed of a preamp or a comparator using a differential amplifier. The multistage amplifier may be formed by connecting the preamps or the comparators in cascade.

A number of applications are available for a multistage amplifier to various electronic devices. An analog-digital converter is one such device that employs a multistage amplifier. For instance, an analog-digital converter may have a plurality of amplifiers that are connected in an open-loop structure in which there is no feedback for high-speed operation.

Where an analog-digital-converter employs a multistage amplifier, effects caused by mismatch, offset, and glitch in a comparator, which is the very end terminal, may be reduced by using a gain of each amplifier. Furthermore, a higher resolution of the analog-digital converter may be achieved where a multistage amplifier is used instead of a single amplifier.

However, in the case of using a plurality of amplifiers, the overall operation speed may become slower due to delay of each amplifier. Since the analog-digital converter may compare an input signal to a reference signal to detect a zero-crossing point using a comparator, and then encode a value corresponding to the detected zero-crossing point to obtain a digital output, the overall performance of the analog-digital converter may depend on how fast and accurately each amplifier is settled at the zero-crossing point.

SUMMARY

In one general aspect, there is provided a method of settling a multistage amplifier using a multiphase clock signal and a multistage amplifier using the same.

The method of settling multistage amplifier using a multiphase clock signal and multistage amplifier using the same may improve an operation speed of the multistage amplifier and obtain a stable output signal.

In another general aspect, a multistage amplifier includes a plurality of amplifiers to amplify an input signal according to a gain of each amplifier and output the amplified signal, a plurality of preset switches to settle the corresponding amplifiers based on clock signals, and a clock generator to apply the clock signals to the respective preset switches to sequentially settle the amplifiers.

The amplifiers may be connected in cascade. Each of the preset switches may be provided to an output of the corresponding amplifier and connected to the clock generator. At least two of the clock signals may be out of phase with one another.

The clock generator may generate a multiphase clock signal to turn off the preset switches sequentially.

The clock generator may generate a clock signal which is delayed from a clock signal that is applied to a preceding preset switch and apply the delayed clock signal to a following preset switch such that an output of the following amplifier is settled after an output of the preceding amplifier passes a zero-crossing point and is settled.

The clock generator may include a replica delay cell having a plurality of amplifiers.

The clock generator may be formed a plurality of inverters.

In still another general aspect, an analog-digital converter includes a track-hold switch, an encoder, and a multistage amplifier which comprises a plurality of amplifiers to amplify an input signal according to a gain of each amplifier, a plurality of preset switches to sequentially settle the corresponding amplifiers based on clock signals, and a clock generator to apply the clock signals to the respective preset switches.

In yet another general aspect, a method of settling an amplifier includes generating a plurality of different clock signals, and applying the clock signals to respective preset switches to sequentially settle amplifiers that are connected to amplify an input signal according to a gain of each amplifier.

The clock signals may turn off the respective preset switches such that an output of a following amplifier is settled after an output of a preceding amplifier passes a zero-crossing point and is settled.

The generating of a plurality of different clock signals may comprise generating a reference clock signal and clock signals, each of the clock signals being delayed from the reference clock signal.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, unless otherwise described, the same drawing reference numerals will be understood to refer to the same elements, features, and structures. The elements may be exaggerated for clarity and convenience.

DETAILED DESCRIPTION

The following detailed description is provided to assist the reader in gaining a comprehensive understanding of the media, apparatuses, methods and/or systems described herein. Accordingly, various changes, modifications, and equivalents of the systems, methods, apparatuses and/or media described herein will be suggested to those of ordinary skill in the art. Also, description of well-known functions and constructions are omitted to increase clarity and conciseness.

Figure 1:
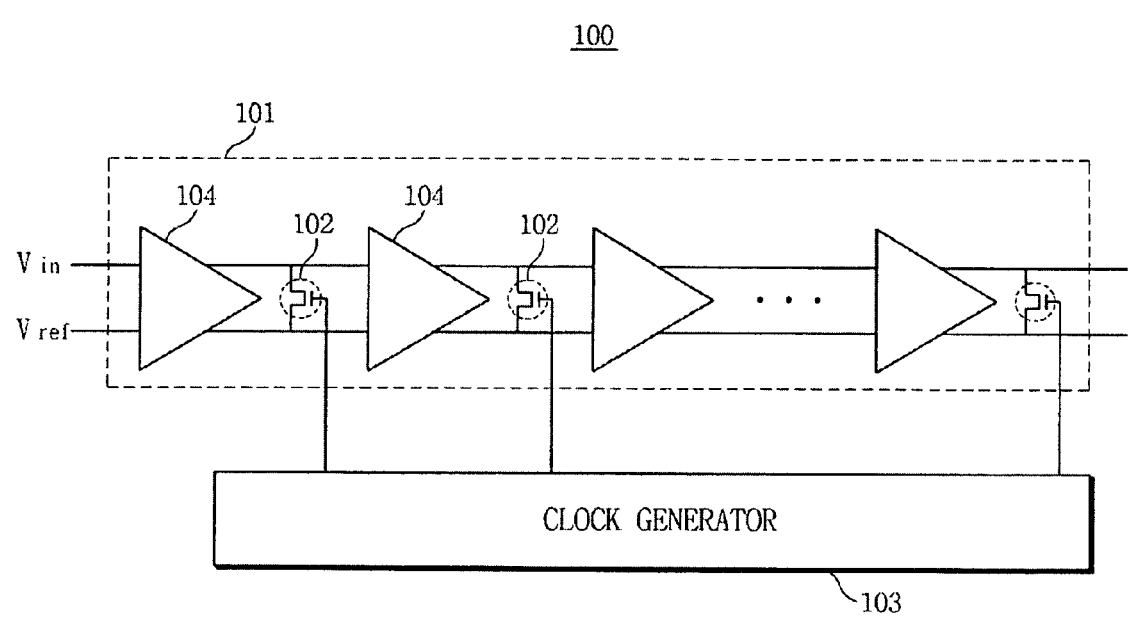
FIG. 1 is a configuration diagram illustrating a multistage amplifier according to an exemplary embodiment.

FIG. 1 illustrates an exemplary multistage amplifier 100. As illustrated in FIG. 1, the multistage amplifier 100 includes an amplifier chain 101 having a plurality of amplifiers 104 and a plurality of preset switches 102, and a clock generator 103.

The amplifier chain 101 amplifies an input signal according to a unique gain of each amplifier 104 and outputs the amplified signal. The amplifier chain 101 may be formed by the plurality of amplifiers 104 connected to one another in cascade. In the amplifier chain 101, each amplifier 104 may compare an input voltage Vin and a reference voltage Vref and amplify a voltage corresponding to the difference between the input voltage Vin and the reference voltage Vref by a predetermined multiple to output a differential voltage through two output ends.

The amplifiers 104 included in the amplifier chain 101 may be formed of preamps and/or comparators. For example, where the multistage amplifier 100 is used for an analog-digital converter (ADC), at least one of front amplifiers of the amplifier chain 101 may be a preamplifier that amplifies an input signal, and at least one of rear amplifiers of the amplifier chain 101 may be a comparator that receives the amplified signal and outputs a discrete signal.

The amplifier chain 101 may have an open loop configuration, which does not need feedback, for a high-speed operation, and an analog-digital-converter of a flash type or a folding type may be implemented by using the amplifier chain 101.

Each preset switch 102 may be located between the neighboring amplifiers 104 and settle or reset the output of the corresponding amplifier 104. To this end, a source and a drain of the preset switch 102 are connected to respective output ends of the amplifier 104, and a gate of the preset switch 102 is connected to the clock generator 103. A MOS transistor switch that is turned on and off according to a clock signal from the clock generator 103 may be used as the preset switch 102. For instance, the preset switch 102 may be formed of a P-MOS transistor so that it may be turned on where an applied clock signal is "LOW" and turned off where an applied clock signal is "HIGH".

For example, where the preset switch 102 is in an ON state, since both output ends of the amplifier 104 are connected to each other, the output voltage difference becomes 0 (reset state). Alternatively, where the preset switch 102 is in an OFF state, the output ends of the amplifier 104 are disconnected from each other and the amplifier 104 starts operating to amplify and output an input according to a predetermined gain (settling state). Since the amplifier 104 may be formed of a dynamic circuit which operates according to a predetermined clock signal, the reset state indicates an initial state of the amplifier 104 operation and the settling state indicates a state where the amplifier 104 amplifies the input signal according to a gain of the amplifier 104.

Generally, where the input of the amplifier 104 changes quickly, the output of the amplifier 104 changes quickly, and where the input is settled, the output end is also settled. However, in this case, where the operating speed of the amplifier 104 cannot follow up with an input frequency, an instance may occur in which a starting value of settling of the output end is placed in the opposite of a value to be finally settled. Accordingly, the time for settling of the amplifier 104 may be increased. Where the preset switch 102 is used for the output end of each amplifier 104, since the settling starts at a zero-crossing point when the settling begins in each amplifier 104, the overall speed of the amplifier 104 may become faster than the case of using no switch.

For example, where the preset switch 102 is turned on and/or off in response to a predetermined clock signal, an output of the amplifier 104 may be settled at a zero point. Specifically, where the preset switch 102 is turned on, a differential output voltage converges to the zero point and the preset switch 102 is reset, and where the preset switch 102 is turned off, the amplifier 104 starts the amplifying function and thus a fast settling may be achieved.

The clock generator 103, which generates a plurality of clock signals which the preset switches 102 operate in response to, is connected to the preset switches 102 and applies different clock signals to respective preset switches 102 to cause the amplifiers 104 to settle sequentially. To this end, the clock generator 103 may apply a reference clock signal and clock signals which are delayed from the reference clock signal to respective preset switches 102 to turn off the preset switches 102 sequentially. For instance, where the clock generator 103 turns off the preset switches 102 sequentially, the amplifiers 104 may settle in response to the clock signals from the clock generator 103.

Where the preset switches 102 are driven by a single clock signal, delay of each amplifier 104 itself and a resistance component of each preset switch 102 may cause an unwanted wave form of the output. In other words, output signals may not pass through the zero crossing point where an input signal is settled and the preset switch 102 opens the output ends of the amplifier 104. And where these output signals enter the following amplifier 104, the unwanted signals may be amplified more and delayed.

However, where the preset switch 102 is turned off in a predetermined period of time after a preceding preset switch is turned off, an output of the preceding amplifier is settled to a value of where the output passes the zero crossing point, and where the settled output is applied to the following preset switch as an input signal and the following preset switch is settled, a stable settling may be achieved.

Figure 2:
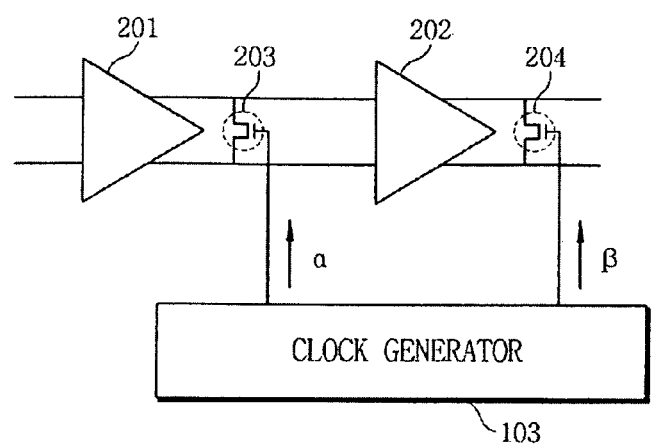
FIG. 2 is a diagram illustrating an operation of an amplifier according to an exemplary embodiment.
Figure 2:
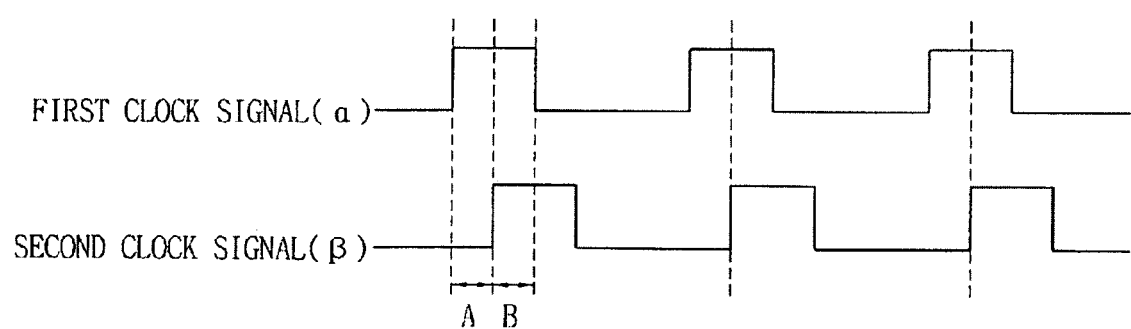

FIG. 2 illustrates how amplifiers are sequentially settled according to an exemplary embodiment. Referring to FIG. 2, a first clock signal α and a second clock signal β are generated by the clock generator 103, and the first clock signal α is applied to a first preset switch 203 which is placed before a second preset switch 204, and the second clock signal β is applied to the second preset switch 204. Each of the first and second preset switches 203 and 204 may be formed of a P-MOS transistor, which is turned on where the clock signal is in a LOW state.

In a section A, the first clock signal α is in a HIGH state, and the second clock signal β is in a LOW state. Therefore, the first preset switch 203 is turned off and hence a first amplifier 201, whose output ends are disconnected from each other, is settled. Meanwhile, the second preset switch 204 remains turned on, and thus both output ends of a second amplifier 202, which are connected to the second preset switch 204, become connected to each other and stay in a reset state.

Afterwards, in a section B, the second clock signal β shifts to a HIGH state while the first clock signal α stays in a HIGH state. Consequently, the second preset switch 204 is turned off and the second amplifier 202 begins to be settled. At this time, since a predetermined period of time has elapsed since the first amplifier 201 started being settled, an output that has passed the zero-crossing point becomes input to the second amplifier 202.

That is, in the process of settling an output of a preceding amplifier, an output of a following amplifier stays in a reset state, and then the output of the following amplifier starts being settled after the output of the preceding amplifier passed a zero-crossing point and has been sufficiently settled. Therefore, in an multistage amplifier according to an exemplary embodiment, even where an output value of a preceding amplifier changes near the zero-crossing point, it rarely affects the settling of the next amplifier stage, thereby reducing the overall settling time.

As described above, the clock generator 103 generates a plurality of different clock signals in order to settle the amplifiers 201 and 202. As shown in FIG. 2, clock signals that partly overlap each other and are thus slightly delayed from each other may be used.

Figure 3:
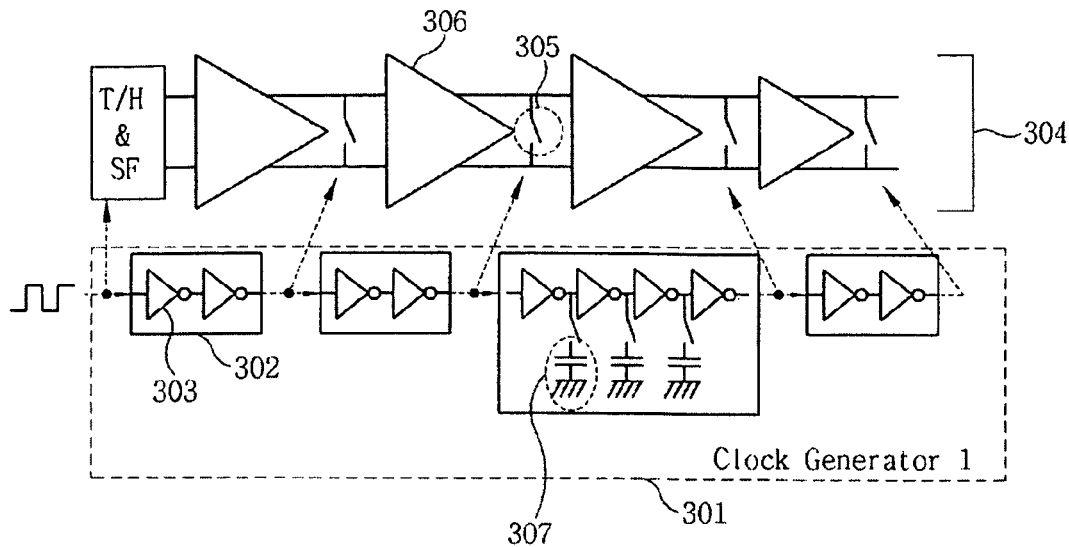
FIG. 3 is a diagram illustrating a clock generator according to an exemplary embodiment.

FIG. 3 illustrates an exemplary clock generator 301 which employs inverters 303. Referring to FIG. 3, the clock generator 301 includes a plurality of delaying units 302 each of which slightly delays a reference clock signal. Each delaying unit 302 may be formed of inverters 303 of which a delay rate is appropriately set. The delay rate may be set to correspond to a delay of a respective amplifier 306 which may be obtained from a simulation of an operation of an amplifier chain 304.

The delaying units 302 are connected in a multistage manner, and each stage may delay a reference clock signal and apply the delayed clock signal to a respective preset switch 305. Where the preset switch 305 is formed of a P-MOS transistor, and the preset switch 305 is turned off and the amplifier 306 is settled where the clock generator 301 applies a signal of a HIGH state to the preset switch 305, a reference clock signal passes through each delay unit 302 and is applied to each preset switch 305 so that the preset switches 305 are turned off sequentially starting from a preceding preset switch to a following preset switch, and the amplifiers 306 are correspondingly settled.

Moreover, where there is a possibility of occurrence of significant changes in delay components, the delay components may be controlled by connecting a load capacitor 307 to an output of the inverter 303, like a voltage control oscillator in a phase locked loop (PLL).

Figure 4:
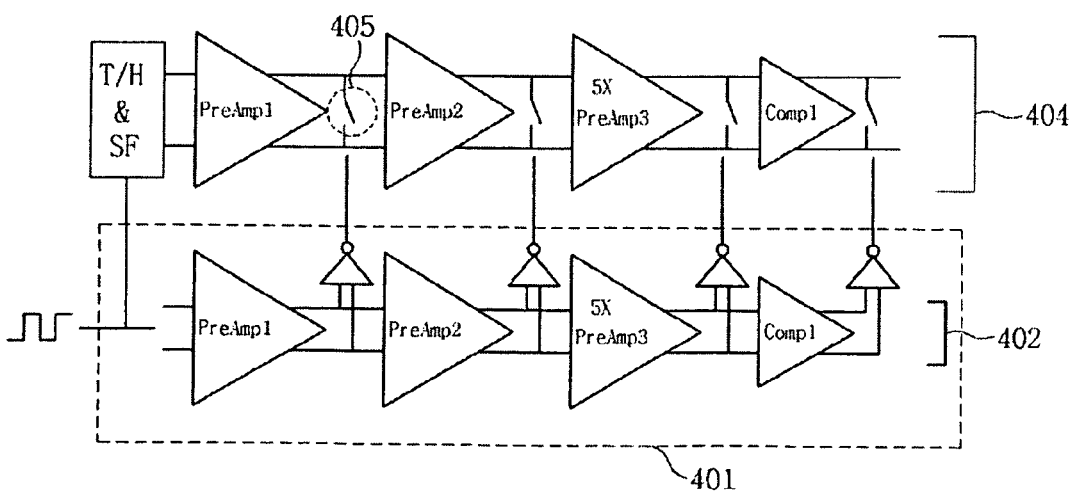
FIG. 4 is a diagram illustrating a clock generator according to another exemplary embodiment.

FIG. 4 illustrates a clock generator 401 according to another exemplary embodiment, which employs a replica delay cell 402 that includes the same amplifiers as an amplifier chain 404. As shown in FIG. 4, the replica delay cell 402 has the same configuration as the amplifier chain 404 except for preset switches 405. Specifically, the replica delay cell 402 may be formed of amplifiers which are the same as the amplifiers in the amplifier chain 404 and are connected in a multistage manner. In addition, the replica delay cell 402 generates a clock signal which turns off the preset switch 405 at the same time where an original output of the amplifier is passing by a zero-crossing point.

Accordingly, the reference clock signal becomes deliberately delayed while passing through each amplifier of the replica delay cell 402, and a delayed signal is applied to each preset switch 405 so that the amplifiers in the amplifier chain 404 may be sequentially settled.

Figure 5:
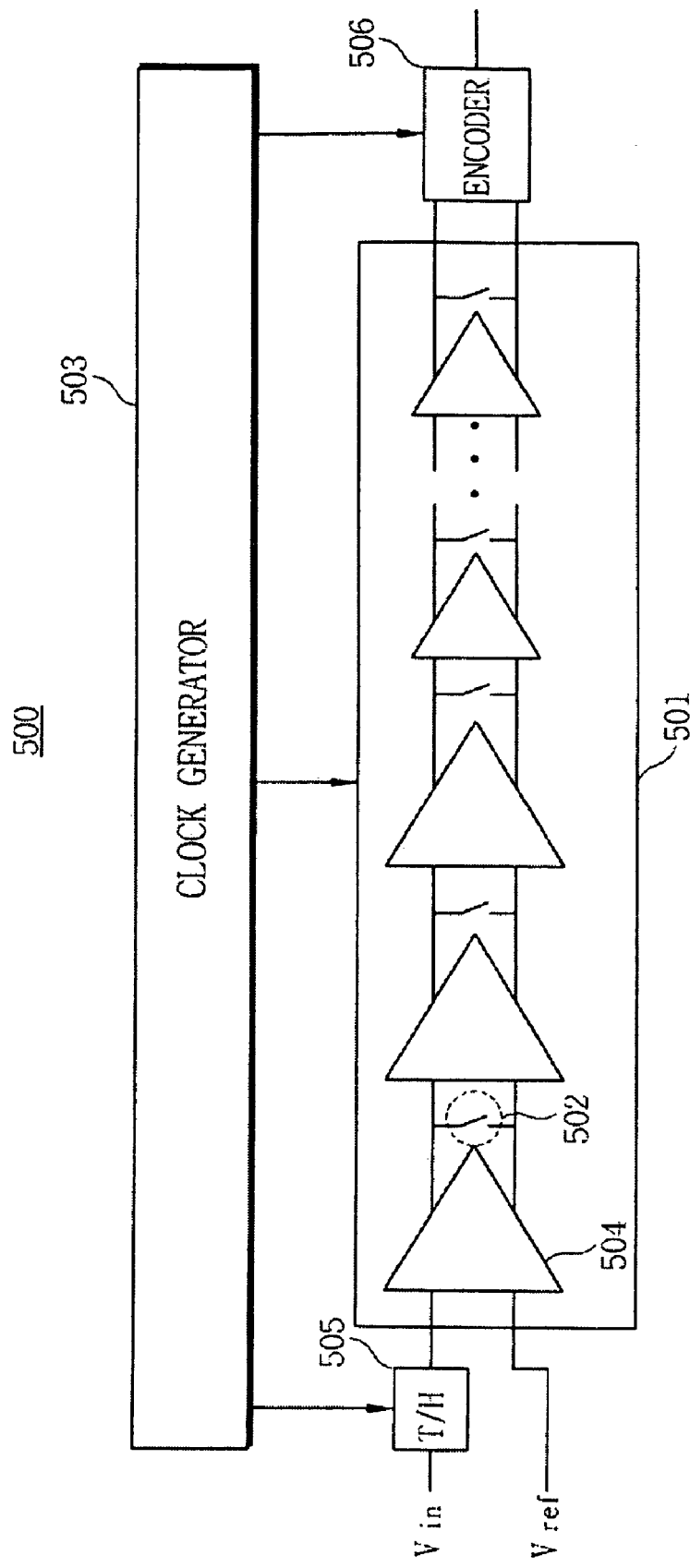
FIG. 5 is a diagram illustrating an analog-digital converter according to an exemplary embodiment.

FIG. 5 illustrates an analog-digital converter 500 which includes a multistage amplifier using a multiphase clock signal according to an exemplary embodiment. As illustrated in FIG. 5, the exemplary analog-digital converter 500 includes a clock generator 503 which generates different clock signals and applies the clock signals to a track-hold switch 505, an amplifier chain 501, and an encoder 506. The clock generator 503 applies a clock signal to the amplifier chain 501 to sequentially turn off preset switches 502. The track-hold switch 505 may be applied a clock signal which is faster than a clock signal to be applied to the amplifier chain 501, and the encoder 506 may be applied a clock signal which is slower than a clock signal to be applied to the amplifier chain 501.

In an operation of the analog-digital converter 500 of FIG. 5, the track-hold switch 505 samples and holds an input voltage Vin according to the applied clock signal and transmits the input voltage Vin to the amplifier chain 501, and the amplifier chain 501 compares the input voltage Vin to a reference voltage Vref and multiplies the difference therebetween. An output signal from the amplifier chain 501 is input to the encoder 506, and the encoder 506 converts the signal into a digital signal.

The amplifiers 504 in the amplifier chain 501 may be formed of preamplifiers and/or comparators, and the amplifiers 504 are sequentially settled in response to a clock signal from the clock generator 503. For example, respective preset switches 502 can be sequentially turned off in response to the clock signal from the clock generator 503, so that an output of a following amplifier becomes settled after an output of a preceding amplifier has passed a zero-crossing point and has been settled.

In such an analog-digital converter, since a multiphase clock signal allows respective amplifiers to be settled, each amplifier may work stably even where a dynamic frequency of an input/output signal is high. Thus, the analog-digital converter may be applied to a device that operates at high speed. Moreover, although in FIG. 5, the multistage amplifier according to an exemplary embodiment is applied to a flash-type analog-digital converter, it is not limited thereto, and the multistage amplifier may be used in other type of converters including a folding-type analog-digital converter.

Figure 6:
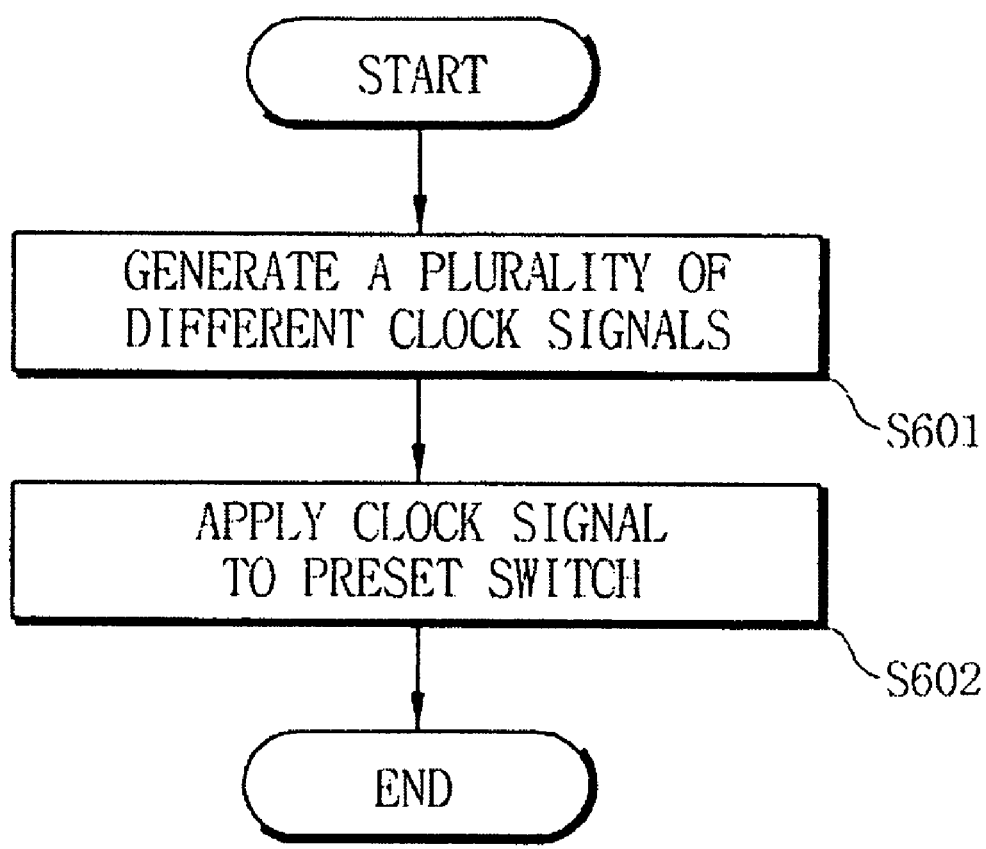
FIG. 6 is a flowchart illustrating a method for settling an amplifier according to an exemplary embodiment.

FIG. 6 illustrates a method of settling an amplifier using a multiphase clock signal according to an exemplary embodiment.

As an illustration only, the method may be applied to a plurality of amplifiers connected to one another in cascade as shown in FIG. 2. Referring to FIGS. 2 and 6, the method includes generating a plurality of different clock signals using the clock generator 103 (operation S601), and applying the clocks signals to the respective preset switches 203 and 204 (operation S602).

The different clock signals may include a reference clock signal and clock signals, each of which is delayed slightly from the reference clock signal such that the first preset switch 203 and the second preset switch 204 are sequentially turned off. Moreover, the clock signals may partly overlap one another. For example, the different clock signals, as shown in FIG. 2, reset the second amplifier 202 (see section A) while the first amplifier 201 is settled. Then, the different clock signals settle the second amplifier 202 (see section B) after an output of the first amplifier 201 passes a zero-crossing point.

Accordingly, where preset switches, each of which is located between neighboring amplifiers, are sequentially turned off in response to different clock signals, an output of a preceding amplifier in an amplifier chain is input to a following amplifier after the output of the preceding amplifier passes a zero-crossing point and is sufficiently settled, and then the following amplifier starts being settled. Consequently, settling of an output of each amplifier may be stably performed. Thus, a high-speed operation may be ensured for an analog-digital converter by an appropriately scheduled settling.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multistage amplifier comprising:
   a plurality of amplifiers to amplify an input signal according to a gain of each amplifier and output the amplified signal;
   a plurality of preset switches to settle the corresponding amplifiers based on clock signals; and
   a clock generator to generate a multiphase clock signal to turn off the preset switches sequentially and to apply the multiphase clock signal to the respective preset switches to sequentially settle the amplifiers.

2. The multistage amplifier of claim 1, wherein the amplifiers are connected in cascade.

3. The multistage amplifier of claim 1, wherein each of the preset switches is provided to an output of the corresponding amplifier and connected to the clock generator.

4. The multistage amplifier of claim 1, wherein at least two of the clock signals are out of phase with one another.

5. The multistage amplifier of claim 1, wherein the clock generator generates a clock signal which is delayed from a clock signal that is applied to a preceding preset switch and applies the delayed clock signal to a following preset switch such that an output of the following amplifier is settled after an output of the preceding amplifier passes a zero-crossing point and is settled.

6. The multistage amplifier of claim 1, wherein the clock generator comprises a plurality of inverters.

7. The multistage amplifier of claim 1, wherein the clock generator comprises a replica delay cell having a plurality of amplifiers.

8. An analog-digital converter comprising a track-hold switch, an encoder and a multistage amplifier which comprises:
   a plurality of amplifiers to amplify an input signal according to a gain of each amplifier;
   a plurality of preset switches to sequentially settle the corresponding amplifiers based on clock signals; and
   a clock generator to generate a multiphase clock signal to turn off the preset switches sequentially and to apply the multiphase clock signal to the respective preset switches to sequentially settle the amplifiers.

9. A method of settling an amplifier, the method comprising:
   generating a plurality of different clock signals; and
   applying the clock signals to respective preset switches to sequentially settle amplifiers that are connected to amplify an input signal according to a gain of each amplifier,
   wherein the clock signals turn off the respective preset switches such that an output of a following amplifier is settled after an output of a preceding amplifier passes a zero-crossing point and is settled.

10. The method of claim 9, wherein the generating of the plurality of different clock signals comprises generating a reference clock signal and clock signals, each of the clock signals being delayed from the reference clock signal.

* * * * *